(12) United States Patent
Hable et al.

(10) Patent No.: US 10,079,195 B2
(45) Date of Patent: Sep. 18, 2018

(54) SEMICONDUCTOR CHIP PACKAGE COMPRISING LATERALLY EXTENDING CONNECTORS

(71) Applicant: Infineon Technologies AG, Neubiberg (DE)

(72) Inventors: Wolfram Hable, Neumarkt (DE); Martin Gruber, Schwandorf (DE); Juergen Hoegerl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/292,554

(22) Filed: Oct. 13, 2016

(65) Prior Publication Data

US 2017/0200666 A1 Jul. 13, 2017

(30) Foreign Application Priority Data

Jan. 8, 2016 (DE) .................. 10 2016 000 264

(51) Int. Cl.
| | |
|---|---|
| H01L 23/12 | (2006.01) |
| H01L 23/373 | (2006.01) |
| H01L 21/48 | (2006.01) |
| H01L 21/56 | (2006.01) |
| H01L 23/31 | (2006.01) |
| H01L 23/00 | (2006.01) |
| H01L 25/18 | (2006.01) |
| H02M 3/158 | (2006.01) |
| H02M 5/293 | (2006.01) |
| H02M 5/297 | (2006.01) |
| H02M 7/217 | (2006.01) |
| H02M 7/537 | (2006.01) |

(52) U.S. Cl.
CPC ...... *H01L 23/3735* (2013.01); *H01L 21/4882* (2013.01); *H01L 21/565* (2013.01); *H01L 23/3114* (2013.01); *H01L 24/45* (2013.01); *H01L 25/18* (2013.01); *H02M 3/158* (2013.01); *H02M 5/293* (2013.01); *H02M 5/297* (2013.01); *H02M 7/217* (2013.01); *H02M 7/537* (2013.01)

(58) Field of Classification Search
CPC  H01L 27/3735; H01L 21/565; H01L 21/4882
USPC .......................... 257/713, 723, 707
See application file for complete search history.

(56) References Cited

U.S. PATENT DOCUMENTS 5,677,567 A * 10/1997 Ma ................... H01L 23/49537
257/666
7,763,974 B2 * 7/2010 Takahashi ............... H01L 24/49
257/690

(Continued)

*Primary Examiner* — Nitin Parekh
(74) *Attorney, Agent, or Firm* — Dicke, Billig & Czaja, PLLC

(57) ABSTRACT

A semiconductor chip package is disclosed. The package includes a carrier, a plurality of semiconductor chips disposed on the carrier, a first encapsulation layer disposed above the semiconductor chips. A metallization layer is disposed above the first encapsulation layer, the metallization layer including a plurality of first metallic areas forming electrical connections between selected ones of the semiconductor chips. A second encapsulation layer is disposed above the solder resist layer. A plurality of external connectors are provided, each one of the external connectors being connected with one of the first metallic areas and extending outwardly through a surface of the second encapsulation layer.

20 Claims, 9 Drawing Sheets

(56) References Cited

U.S. PATENT DOCUMENTS

| | | | |
|---|---|---|---|
| 8,472,196 B2* | 6/2013 | Zeng | H01L 23/4334 |
| | | | 257/670 |
| 8,552,541 B2* | 10/2013 | Lim | H01L 23/38 |
| | | | 257/675 |
| 8,674,492 B2 | 3/2014 | Ota et al. | |
| 9,064,689 B2 | 6/2015 | Tokumitsu et al. | |
| 9,147,628 B2 | 9/2015 | Otremba et al. | |
| 9,196,510 B2 | 11/2015 | Hohlfeld et al. | |
| 2006/0113664 A1* | 6/2006 | Shiraishi | H02M 7/003 |
| | | | 257/723 |
| 2006/0125072 A1* | 6/2006 | Mihara | H01L 23/5389 |
| | | | 257/686 |
| 2006/0236519 A1* | 10/2006 | Ser | B21D 22/02 |
| | | | 29/432.2 |
| 2012/0236519 A1* | 9/2012 | Chen | H05K 1/181 |
| | | | 361/752 |
| 2013/0240909 A1* | 9/2013 | Hiramatsu | H01L 23/24 |
| | | | 257/77 |
| 2015/0103498 A1* | 4/2015 | Lee | H01L 23/49811 |
| | | | 361/737 |
| 2015/0156864 A1* | 6/2015 | Kobayashi | H05K 1/0218 |
| | | | 361/783 |
| 2016/0254217 A1* | 9/2016 | Lu | H01L 23/49568 |
| | | | 257/675 |

* cited by examiner

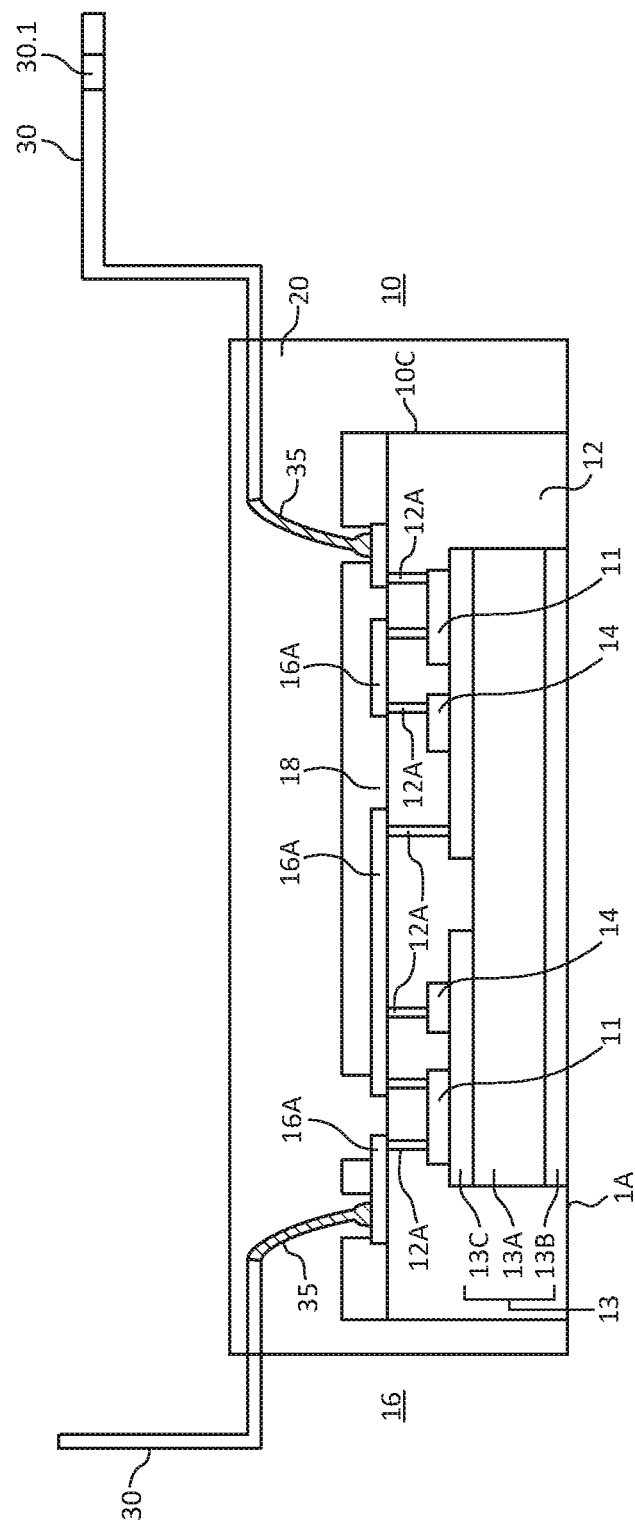

SEMICONDUCTOR CHIP PACKAGE COMPRISING LATERALLY EXTENDING CONNECTORS

CROSS-REFERENCE TO RELATED APPLICATION

This Utility Patent Application claims priority to German Patent Application No. 10 2016 000 264.6, filed Jan. 8, 2016; and which is incorporated herein by reference.

TECHNICAL FIELD

The present disclosure generally relates to semiconductor chip packages and, more particularly, to semiconductor chip packages such as those comprising semiconductor transistor chips, and to a method for fabricating a semiconductor chip package.

BACKGROUND

In many electronic systems it is necessary to employ converters like DC/DC converters, AC/DC converters, DC/AC converters, DC/AC converters, or frequency converters in order to generate the currents, voltages and/or frequencies to be used by an electronic circuit, like, for example, a motor driving circuit. The converter circuits as mentioned before typically comprise one or more half-bridge circuits, each provided by two semiconductor power switches such as e.g. power MOSFET devices, and further components such diodes connected in parallel to the transistor devices, further active components like sensors or processors, and passive components such as inductances and capacitances.

The assembly of the converter circuit and also further individual active or passive components incorporated in these assemblies can in principle be provided as individual components which are mounted on a printed circuit board (PCB). There is, however, a general tendency to save space on the PCB and therefore to provide integrated semiconductor modules having short interconnections between the individual components in order to reduce switching losses and parasitic inductances.

BRIEF DESCRIPTION OF THE DRAWINGS

The accompanying drawings are included to provide a further understanding of examples and are incorporated in and constitute a part of this specification. The drawings illustrate examples and together with the description serve to explain principles of examples. Other examples and many of the intended advantages of examples will be readily appreciated as they become better understood by reference to the following detailed description.

The elements of the drawings are not necessarily to scale relative to each other. Like reference numerals designate corresponding similar parts.

DETAILED DESCRIPTION

Figure 1:
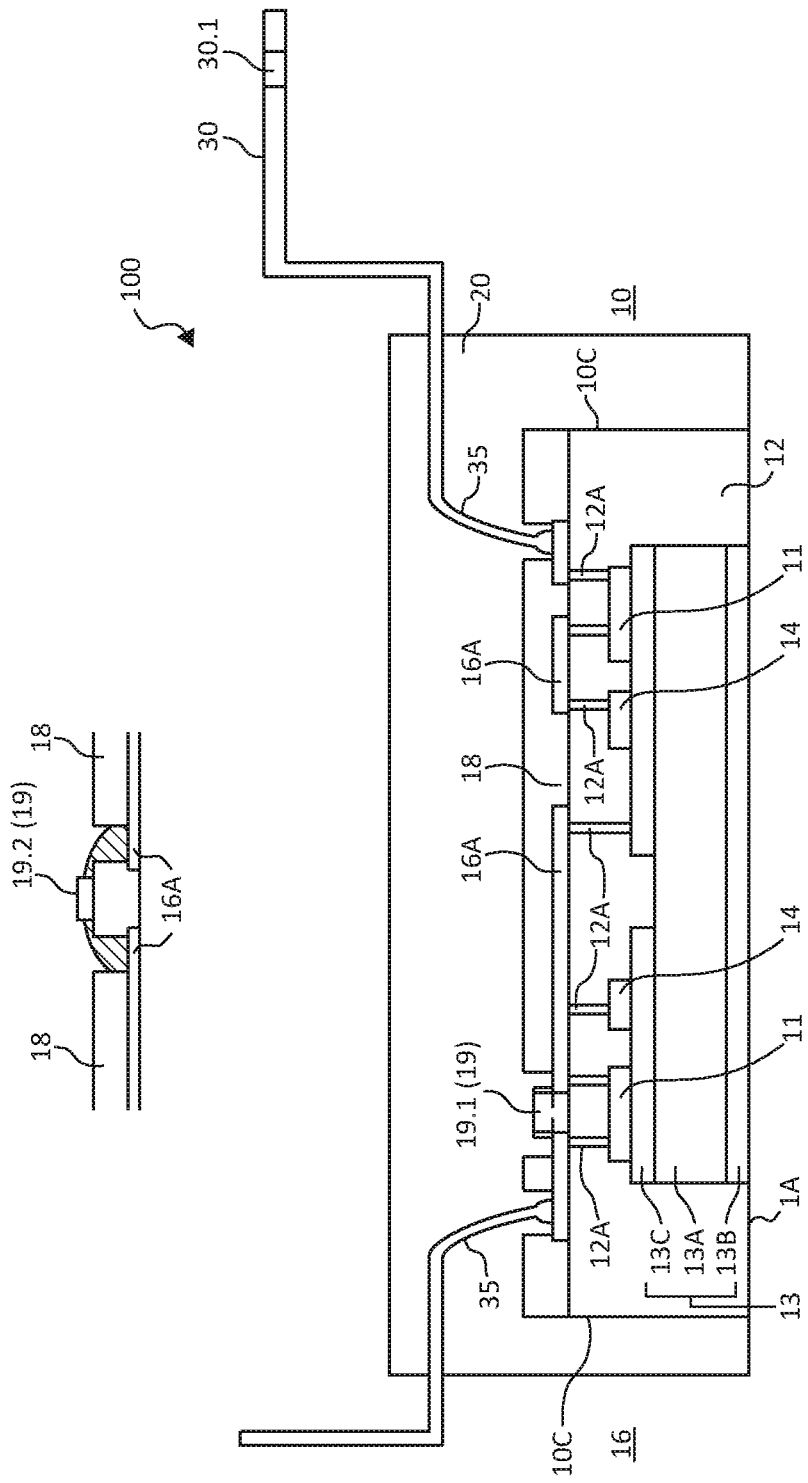
FIG. 1 shows a schematic cross-sectional side view representation of a semiconductor chip package including outwardly extending external connectors and an additional electronic device according to an example, wherein the insert shows another example for arranging the electronic device.

The aspects and examples are now described with reference to the drawings, wherein like reference numerals are generally utilized to refer to like elements throughout. In the following description, for purposes of explanation, numerous specific details are set forth in order to provide a thorough understanding of one or more aspects of the examples. It may be evident, however, to one skilled in the art that one or more aspects of the examples may be practiced with a lesser degree of the specific details. In other instances, known structures and elements are shown in schematic form in order to facilitate describing one or more aspects of the examples. It is to be understood that other examples may be utilized and structural or logical changes may be made without departing from the scope of the present invention. It should be noted further that the drawings are not to scale or not necessarily to scale.

In the following detailed description, reference is made to the accompanying drawings, which form a part hereof, and in which is shown by way of illustration specific aspects in which the invention may be practiced. In this regard, directional terminology, such as "top", "bottom", "front", "back" etc., may be used with reference to the orientation of the figures being described. Since components of described devices may be positioned in a number of different orientations, the directional terminology may be used for purposes of illustration and is in no way limiting. It is understood that other aspects may be utilized and structural or logical changes may be made without departing from the scope of the present invention. The following detailed description, therefore, is not to be taken in a limiting sense, and the scope of the present invention is defined by the appended claims.

In addition, while a particular feature or aspect of an example may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The examples of a semiconductor package and a method for fabricating a semiconductor package may use various types of transistor devices. The examples may use transistor devices embodied in semiconductor dies or semiconductor chips wherein the semiconductor dies or semiconductor chips may be provided in a form of a block of semiconducting material as fabricated from a semiconductor wafer and diced out from the semiconductor wafer, or in another form in which further process steps have been carried out like, for example, applying an encapsulation layer to the semiconductor die or semi-conductor chip. The examples may also use horizontal or vertical transistor devices wherein those structures may be provided in a form in which all contact elements of the transistor device are provided on one of the main faces of the semiconductor die (horizontal transistor structures) or in a form in which at least one electrical contact element is arranged on a first main face of the semiconductor die and at least one other electrical contact element is arranged on a second main face opposite to the main face of the semiconductor die (vertical transistor structures) like, for example, MOS transistor structures or IGBT (Insulated Gate Bipolar Transistor) structures. Insofar as the transistor chips are configured as power transistor chips and if in addition also driver chips are integrated into the package, the examples of a semiconductor package disclosed further below can be classified as intelligent power modules (IPM).

In any case the semiconductor dies or semiconductor chips may include contact elements or contact pads on one or more of their outer surfaces wherein the contact elements serve for electrically contacting the semiconductor dies. The contact elements may have any desired form or shape. They can, for example, have the form of lands, i.e. flat contact layers on an outer surface of the semiconductor die. The contact elements or contact pads may be made from any electrically conducting material, e.g. from a metal as aluminum, gold, or copper, for example, or a metal alloy, or an electrically conducting organic material, or an electrically conducting semiconductor material. The contact elements may also be formed as layer stacks of one or more of the above-mentioned materials.

The examples of a semiconductor package may include an encapsulant or encapsulating material having the semiconductor transistor chips and the at least one semiconductor driver chip embedded therein. The encapsulating material can be any electrically insulating material like, for example, any kind of molding material, any kind of resin material, or any kind of epoxy material. The encapsulating material can also be a polymer material, a polyimide material, a thermoplast material, a silicone material, a ceramic material, and a glass material. The encapsulating material may also comprise any of the above-mentioned materials and further include filler materials embedded therein like, for example, thermally conductive increments. These filler increments can be made of AlO or $Al_2O_3$, AlN, BN, or SiN, for example. Furthermore the filler increments may have the shape of fibers and can be made of carbon fibers or nanotubes, for example. The examples of a semiconductor package may also comprise two different encapsulating materials, one of which having the semiconductor transistor chips embedded therein and the other one of which having the at least one semiconductor driver chip embedded therein.

FIG. 1 shows a cross-sectional side view representation of a semiconductor chip package according to a first aspect.

The semiconductor chip package 100 includes a carrier 13, a plurality of semiconductor chips 11 disposed on the carrier 13, a first encapsulation layer 12 disposed above the semiconductor chips 11 and 14, a metallization layer 16 disposed above the first encapsulation layer 12, the metallization layer 16 comprising a plurality of first metallic areas 16A forming electrical connections between selected ones of the semiconductor chips 11 and 14 and possibly also electrical connections between metallic areas 16A and regions as designated as 13C and possibly also connections between semiconductor chips 11 and 14 and regions 13C. The semiconductor chip package 100 may further include an optional solder resist layer 18 disposed above the metallization layer 16, a second encapsulation layer 20 disposed above the solder resist layer 18, and a plurality of external connectors 30, each one of the external connectors 30 being connected with one of the first metallic areas 16A and extending outwardly through a surface of the second encapsulation layer 20.

As indicated above, the solder resist layer 18 as shown in FIG. 1 can also be omitted. Alternatively when considering, for example, Cu as the material of the metallization layer 16, in order to prevent solder material to flow onto the upper surface of the first metallic areas 16A, certain regions which are to connected with, for example, wire bonds can be covered with a metallic layer like e.g. an Au layer so that these regions become perfectly bondable. The ambient areas of these certain regions which are not covered with the Au layer tend to repel the solder material and therefore act as a solder resist layer. Also other cases might occur in which the material of the metallization layer 16 is not per se perfectly solder-repelling in which cases a physical and/or chemical surface treatment can be carried out, in particular oxidation or sulfiding or nitriding of regions of the upper surface of the first metallic areas 16A so that these regions become solder-repelling. Also other cases might occur in which due to the material of the metallization layer 16, covering with An Au layer for generating bondable regions is not necessary as the material of the metallization layer is per se perfectly bondable.

According to an example of the semiconductor chip package 100 of the first aspect at least some first metallic areas 16A are formed in such a way that they include bondable, solderable, or sinterable upper surfaces. In particular, metallic areas 16A located at edge portions of an upper surface of the first encapsulation layer 12 are formed with bondable upper surfaces so that wire bonds can be connected with them, or they are formed with solderable upper surface so that particular connection elements can be soldered to them, or they are formed with sinterable upper surfaces so that particular connection elements can be sintered to them.

According to an example of the semiconductor chip package 100 of the first aspect, the carrier 13 includes a first main face, a second main face opposite to the first main face, and side faces connecting the first and second main faces, wherein the first encapsulation layer 12 is disposed on the first and second main faces and the side faces of the carrier 13. According to a further example thereof, the second encapsulation layer 20 is disposed on a main face of the solder resist layer 18, if available, and on side faces of the solder resist layer 18 and side faces of the first encapsulation layer 12.

According to an example of the semiconductor chip package 100 of the first aspect, the carrier 13 includes a first main face, a second main face opposite to the first main face, and side faces connecting the first and second main faces, and the first encapsulation layer 12 is disposed on the first and second main faces and the side faces of the carrier 13. According to a further example thereof, the second encapsulation layer 20 is disposed on a main face of the solder resist layer 18, if available, and on side faces of the solder resist layer 18 and side faces of the first encapsulation layer 12.

According to an example of the semiconductor chip package 100 of the first aspect, each one of the external connectors 30 extend outwardly through a side face of the second encapsulation layer 20. According to a further example thereof, the external connectors 30 extend outwardly through two opposing side faces of the second encapsulation layer 20. According to further examples thereof, the external connectors 30 extend outwardly through three side faces or through all four side faces of the second encapsulation layer 20, or even through the upper surface of the second encapsulation layer 20 alone or in combination with one or more of the four side faces.

According to an example of the semiconductor chip package 100 of the first aspect, the external connectors 30 are part of a leadframe.

According to an example of the semiconductor chip package 100 of the first aspect, the external connectors 30 are connected to the first metallic areas 16A by bond wires 35, respectively. According to a further example thereof, particular first metallic areas 16A are connected with only one bond wire with a respective external connector 30. According to another example thereof, particular first metallic areas 16A are connected with a plurality of bond wires 35 with a respective external connector 30.

According to an example of the semiconductor chip package 100 of the first aspect, the external connectors 30 are not connected by wire bonds with the first metallic areas but instead are connected directly with the first metallic areas 16A. According to a further example thereof, a method of directly connecting the external connectors 30 with the first metallic areas 16A may include soldering, adhering, gluing, and sintering.

According to an example of the semiconductor chip package 100 of the first aspect, each one of the external connectors 30 includes a first horizontal portion a part of which is disposed within the second encapsulation layer 20 and another part of which is disposed outside of the second encapsulation layer 20. According to a further example thereof, the first horizontal portions of all of the external connectors 30 lie in one and the same plane. According to a further example thereof, some of the external connectors 30 include second portions adjacent to the first portions and extending in, for example, a vertical direction. According to a further example thereof, some of the external connectors 30 include third portions disposed adjacent to the second portions and extending in a horizontal plane, wherein the third portions of all external connectors 30 may extend in one and the same horizontal plane. The second and third portions of the external connectors 30 may be generated by bending the external connectors 30 by a right angle. It should be added, however, that the first two third portions of the external connectors 30 can also extend in other than horizontal or vertical planes and also that the bending angles for generating the second and third portions can be different from each other and can be different from right angles.

According to an example of the semiconductor chip package 100 of the first aspect, some of the external connectors 30 include through-holes 30.1 at, for example, external ends thereof in order to facilitate connecting the semiconductor chip package 100 to any kind of customer side holding means or holding substrates by screw contacts, plug-in contacts or solder contacts.

According to an example of the semiconductor chip package 100 of the first aspect, the semiconductor chip package 100 further includes electronic devices 19 formed above the solder resist layer 18, if available, and connected to selected ones of the first metallic areas 16A. According to a further example thereof, the electronic devices 19 are selected from the group of passive devices, active devices, resistors, shunt resistors, NTC resistors, inductors, capacitors, sensors, current sensors, drivers, and processors. In particular, the electronic devices 19 can be pre-resistors connected to transistors of the semiconductor transistor chips 11. In particular, the electronic devices 19 may include first electronic devices 19.1 and second electronic devices 19.2. The first electronic devices 19.1 are small size electronic devices like, for example, pre-resistors which are disposed within gaps of the solder resist layer 18 and connected therein with metallic areas 16A, whereas the second electronic devices 19.2 are large size electronic devices like, for example, shunt resistors which are disposed onto the solder resist layer 18 and connected to metallic areas 16A through vias formed the solder resist layer 18 (shown in the insert of FIG. 1).

According to an example of the semiconductor chip package 100 of the first aspect, the semiconductor chip package 100 further includes second metallic areas 15 formed on an upper main face of the first encapsulation layer 12 and connected by via connections to regions 13C of the carrier 13 for improving the dissipation of heat from the semiconductor devices. The second metallic areas 15 are not shown in FIG. 1, but are instead shown in FIG. 5 and will be explained in detail further below. It is also possible that the second metallic areas 15 can be connected with the first metallic areas 16A.

According to an example of the semiconductor chip package 100 of the first aspect, the first semiconductor module 10 includes a carrier 13. According to an example the carrier 13 includes a substrate 13A comprising an insulating, dielectric or ceramic layer or tile, and a first metallic layer 13B on a lower surface of the substrate 13A and a second metallic layer 13C on an upper surface of the substrate 13A, wherein the second metallic layer 13C is structured into different regions separated from each other. The regions 13B are not electrically connected with the regions 13C. According to an example the carrier 13 may include one or more of a direct copper bonded (DCB) substrate, a direct aluminum bonded (DAB) substrate, and an active metal brazing substrate, wherein the substrate may include a ceramic layer, in particular one or more of AlO, AlN, $Al_2O_3$, or a dielectric layer, in particular $Si_3N_4$. According to an example, the carrier 13 may include a first upper surface, a second lower surface opposite to the first upper surface, and side faces connecting the first and second surfaces, wherein the first encapsulation layer 12 may cover the first upper surface and the side faces of the carrier 13. According to an example, the carrier 13 may include a substrate 13A which may be an inorganic or an organic substrate. The core of the substrate 13A, in particular of the organic substrate, may include a thermal conductivity better than 1 W/mK. According to an example, the carrier 13 may include a thickness in a range from 0.1 mm to 2.0 mm, in particular in a range from 0.8 mm to 2.0 mm.

According to an example of the semiconductor chip package 100 of the first aspect, the semiconductor chips 11 and 14 may include semiconductor transistor chips 11 and semiconductor diode chips 14, wherein the semiconductor diode chips 14 can be configured as flyback diodes. According to an example, each one of the semiconductor transistor chips 11 is connected with one of the semiconductor diode chips 14 in parallel. As was already explained before, the metallization layer 16 includes a plurality of metallic areas 16A forming electrical connections between selected ones of the semiconductor transistor chips 11 and the semiconductor diode chips 14. In addition the first encapsulation layer 12 may include via connections 12A connecting the metallic areas 16A with selected ones of the semiconductor transistor chips 11 and the semiconductor diode chips 14. The via connections 12A will be described in more detail below, in particular they may include lateral diameters greater than 50 μm. The metallic areas 16A can also be connected with parts of the regions 13C by via connections.

According to an example of the semiconductor chip package 100 of the first aspect, the semiconductor chips 11 include semiconductor transistor chips, in particular semiconductor power transistor chips. According to an example, the semiconductor transistor chips 11 are interconnected to form an AC/AC converter circuit, an AC/DC converter circuit, a DC/AC converter circuit, a DC/DC converter circuit or a frequency converter.

According to an example of the semiconductor chip package 100 of the first aspect, each one of the semiconductor diode chips 14 may be connected in parallel to one of the semiconductor transistor chips 11.

According to an example of the semiconductor chip package 100 of the first aspect, one or more of the semiconductor transistor chips 11 and the semiconductor diode chips 14 include a thickness in a range from 5 μm to 700 μm, in particular from 30 μm to 100 μm, in particular from 50 μm to 80 μm.

According to an example of the semiconductor chip package 100 of the first aspect, the semiconductor transistor chips 11 each include one or more of a power transistor, a vertical transistor, an MOS transistor, and an insulated gate bipolar transistor (IGBT). According to an example, the semiconductor material of one or more of the semiconductor transistor chips 11 and the semiconductor diode chips 14 may be based on Si, GaN, SiC or any other semiconductor material.

According to an example of the semiconductor chip package 100 of the first aspect, one or more of the first encapsulation layer 12 and the second encapsulation layer 20 includes one or more of a polymer material, a mold compound material, a resin material, an epoxy-resin material, a multiaromatic epoxy-resin material, an acrylate material, a polyimide material, and a silicone-based material. According to an example, the first and second encapsulation layers 12 and 20 include different materials.

According to an example of the semiconductor chip package 100 of the first aspect, the via connections 12A formed into the first encapsulation layer 12 may include lateral diameters in a range from 0.05 mm to 1 mm, in particular from 0.3 mm to 0.7 mm. According to an example, the via connections 12A include a ratio of height to width in a range from 0 to 3, preferably in a range from 0.3 to 3.

According to an example of the semiconductor chip package 100 of the first aspect, the via connections 12A include via holes through the encapsulation layer 12, the via holes being filled completely or in part with an electrically conducting material like, for example, a metal as, for example, copper. The electrically conducting material can be filled into the via holes in such a way that the via holes are not completely filled by the material but instead the material only covers the walls of the via holes with a thickness less than half the diameter of the via holes.

According to an example of the semiconductor chip package 100 of the first aspect, the semiconductor chip package 100 includes one or more half-bridge circuits wherein in each half-bridge circuit two semiconductor transistor chips 11 are connected in series. In particular, the semiconductor chip package 100 may include six semiconductor transistor chips 11 wherein two respective semiconductor transistor chips 11 are connected in series to form three half-bridge circuits.

According to an example of the semiconductor chip package 100 of the first aspect, each one of the semiconductor transistor chips 11 is connected with one of the semiconductor diode chips 14 in parallel. In particular, the first semiconductor module 10 may include six semiconductor transistor chips 11 and six semiconductor diode chips 14 each of them connected in parallel to one of the semiconductor transistor chips 11.

The present disclosure also relates to a semiconductor package according to a second aspect. The semiconductor chip package according to the second aspect includes a carrier, a plurality of semiconductor chips disposed on the carrier, a first insulation layer disposed above the semiconductor chips, a metallization layer disposed above the first insulation layer, the metallization layer comprising a plurality of first metallic areas forming electrical connections between selected ones of the semiconductor chips, a second insulation layer disposed above the metallization layer, a plurality of external connectors, each one of the external connectors being connected with one of the first metallic areas and extending outwardly through a surface of the second insulation layer.

The semiconductor chip package according to the second aspect further includes the first insulation layer comprising via connections formed therein, the via connections connecting selected ones of the semiconductor chips with selected ones of the first metallic areas.

The semiconductor chip package according to the second aspect further includes the carrier comprising one or more of a direct copper bonded substrate, a direct aluminum bonded substrate, and an active metal brazing substrate, wherein the substrate includes a ceramic layer or a dielectric layer.

The semiconductor chip package according to the second aspect further includes the plurality of semiconductor chips comprising a plurality of semiconductor transistor chips and a plurality of diode chips.

The semiconductor chip package according to the second aspect further includes the semiconductor transistor chips and the semiconductor diode chips being connected to form an AC/AC converter circuit, an AC/DC converter circuit, a DC/AC converter circuit, a DC/DC converter circuit, or a frequency converter circuit.

Further examples of the semiconductor chip package according to the second aspect can be formed by adding further features as were described above in connection with the semiconductor chip package of the first aspect.

Figure 2:
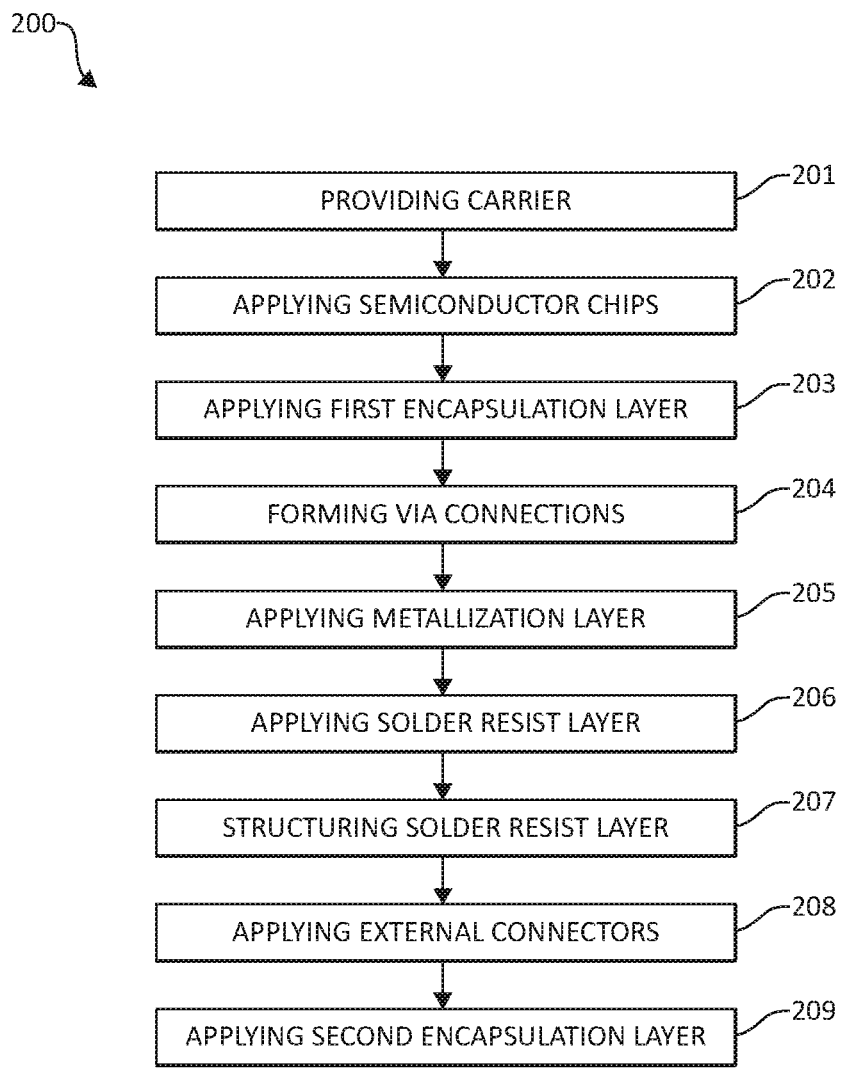
FIG. 2 shows a flow diagram of a method for fabricating a semiconductor chip package according to an example.

FIG. 2 shows a flow diagram of a method according to a third aspect, the method being configured for fabricating a semiconductor chip package according to the first or second aspect as shown and described before.

The method 200 according to the third aspect includes providing a carrier (201), applying a plurality of semiconductor chips onto the carrier (202), applying a first encapsulation layer above the plurality of semiconductor chips and the carrier (203), forming via connections into the first encapsulation layer, the via connections being connected with the plurality of semiconductor chips (204), applying a metallization layer above the first encapsulation layer, the metallization layer comprising a plurality of first metallic areas connected with the via connections (205), applying external connectors to selected ones of the first metallic areas (208), and applying a second encapsulation layer above the metallization layer (209). In particular it is possible that the metallization layer is at first deposited by covering the whole upper surface of the first encapsulation layer, thereby also filling the vias, and afterwards the first metallization layer is structured to yield the first metallic areas.

According to an example of the method of the third aspect, forming via connections into the first encapsulation layer includes forming via holes into the first encapsulation layer and filling a metallic material into the via holes. According to an example thereof, forming via holes into the first encapsulation layer is carried out by laser drilling. According to a further example thereof, filling a metallic material into the via holes is carried out by electro-chemical or galvanical plating or by electroless plating.

According to an example of the method of the third, the method further includes applying a solder resist layer above the metallization layer, wherein the second encapsulation layer is applied above the solder resist layer and above side faces of the solder resist layer and side faces of the first encapsulation layer.

According to an example of the method of the third aspect, applying the first and second encapsulation layers is carried out by transfer molding or compression molding. In particular, applying the first encapsulation layer is carried out by compression molding and applying the second encapsulation layer is carried by transfer molding.

Further examples of the method according to the third aspect can be formed by adding features which were described above in connection with the semiconductor chip package according to the first and second aspects.

In the following an example of the method of FIG. 2 is described in connection with FIG. 3 and FIGS. 4A-4H.

Figure 3:
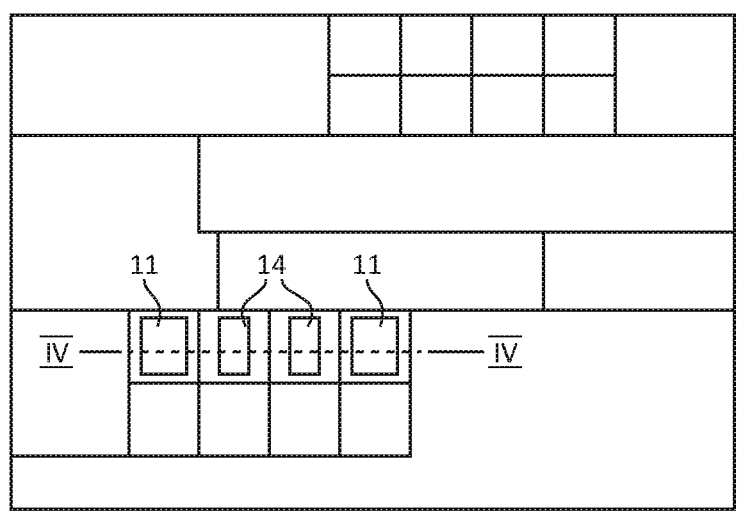
FIG. 3 shows a schematic top view representation of an intermediate product of a method for fabricating a semiconductor chip package, the intermediate product showing a plurality of semiconductor chips disposed on a carrier.

FIG. 3 shows a schematic top view representation of an intermediate product obtained after applying a plurality of semiconductor chips onto a carrier, wherein the carrier may be a DCB as described before. The semiconductor chips may include semiconductor transistor chips 11 and semiconductor diode chips 14. The intermediate product shown in FIG. 3 is an example of an electronic module in which certain areas are pre-reserved for semiconductor chips 11 and 14 and other areas are virtually unused or can be used for other purposes which will be shown and explained later. The following steps are illustrated by cross-sectional side view representations taken in a plane indicated by line IV-IV of FIG. 3.

Figure 4A:
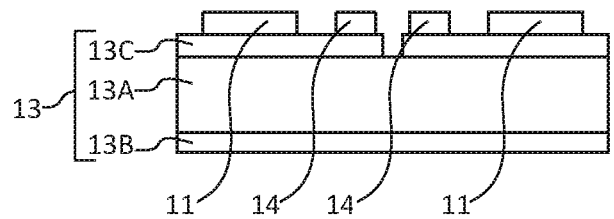
FIG. 4 includes FIG. 4A-4H and shows schematic cross-sectional side view representations for illustrating a method for fabricating a semiconductor chip package according to an example.

FIG. 4A shows a DCB module as an intermediate product of FIG. 3 as just described in a cross-sectional view. A plurality of such DCB modules can be disposed on an auxiliary carrier.

Figure 4B:
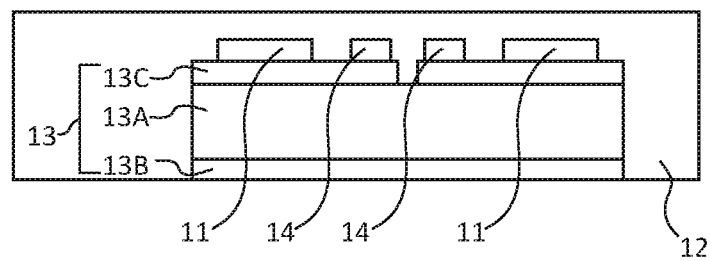

FIG. 4B shows the intermediate product after applying a first encapsulation layer 12 onto the plurality of semiconductor chips 11 and 14 and the carrier 13. The first encapsulation layer 12, for example, can be applied by transfer molding, thereby fabricating an eWLB panel including the plurality of DCB modules.

Figure 4C:
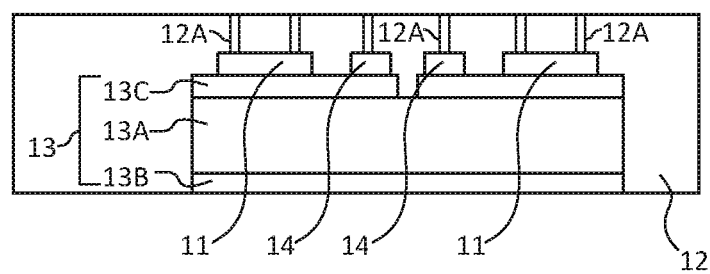

FIG. 4C shows the intermediate product after forming via connections 12A into the encapsulation layer 12, wherein the via connections 12A are connected with contact pads of the semiconductor chips 11 and 14, respectively. The forming of the via connections can be carried out by forming vias by, for example, laser drilling and thereafter filling a metallic material into the vias by, for example, electro-chemical (galvanical) or electroless plating.

Figure 4D:
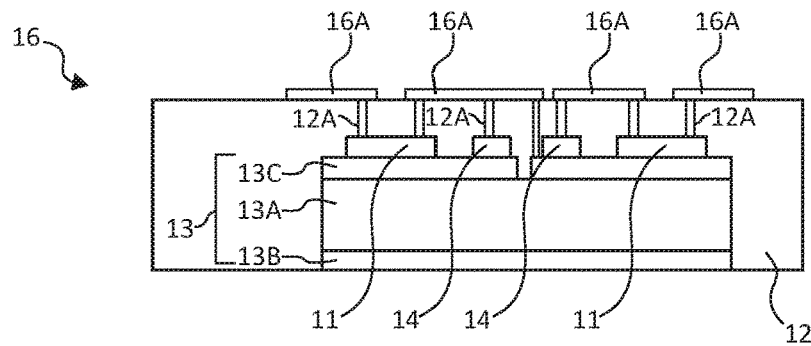

FIG. 4D shows the intermediate product after applying a metallization layer 16 onto the first encapsulation layer 12, wherein the metallization layer 16 includes a plurality of metallic areas 16A connected with the via connections 12A. In particular, applying the metallization layer 16 can be performed with the same deposition method and simultaneously with the filling of metallic material into the vias.

Figure 4E:
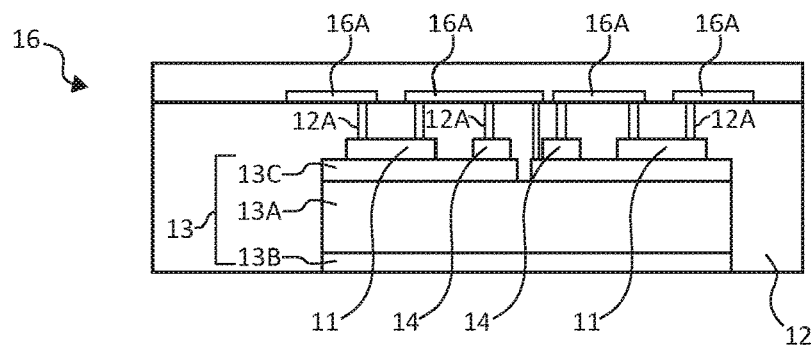

FIG. 4E shows the intermediate product after applying a solder resist layer 18 onto the metallization layer 16 and the first encapsulation layer 12.

Figure 4F:
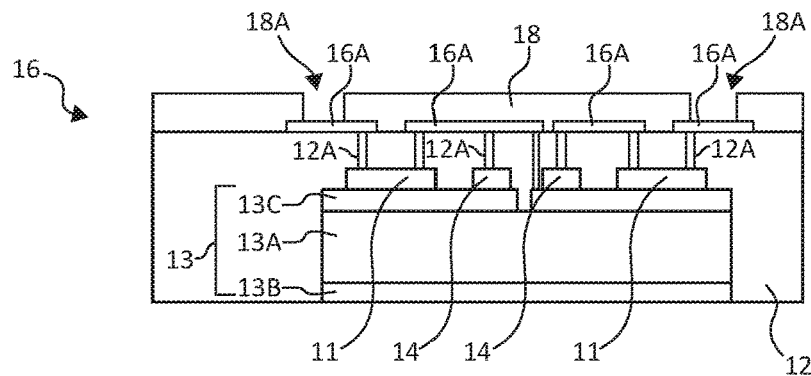

FIG. 4F shows the intermediate product after structuring the solder resist layer 18 to form openings 18A above selected ones of the metallic area 16A. Thereafter the panel is singulated into individual modules, each one including one DCB module.

Figure 4G:
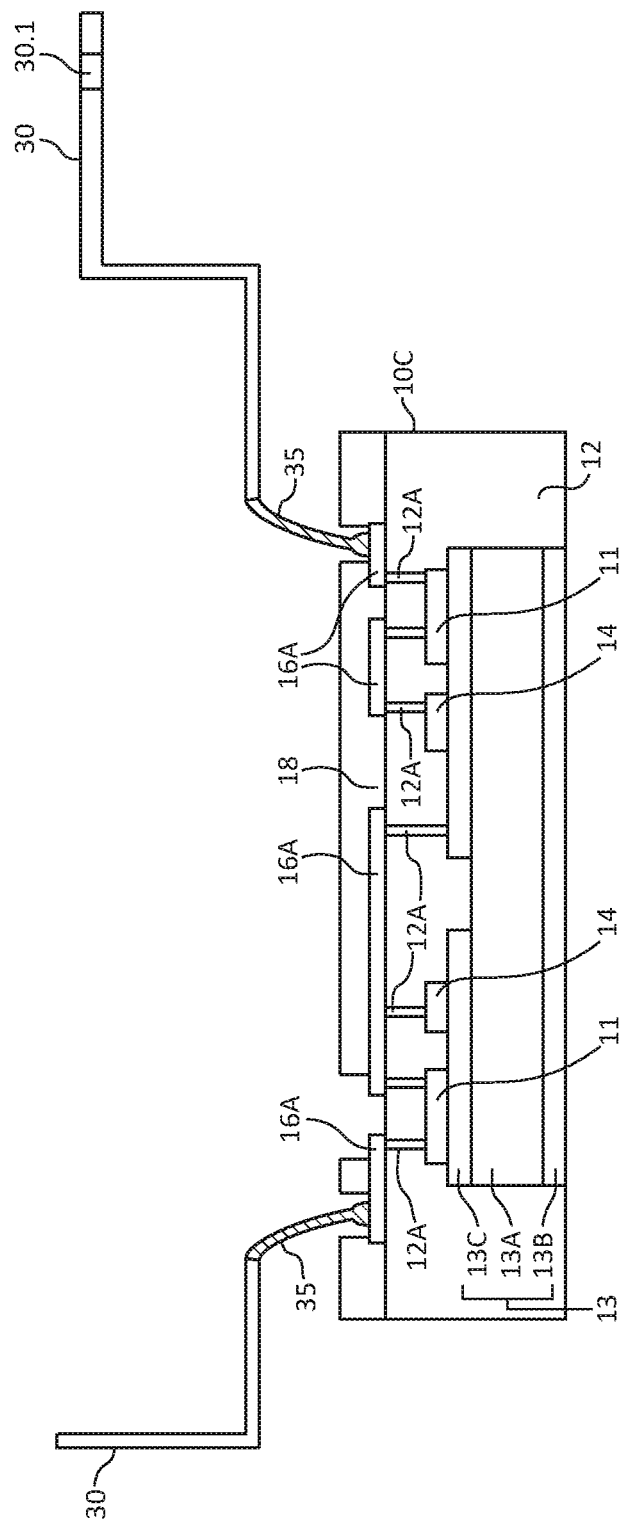

FIG. 4G shows the intermediate product after connecting external connectors 30 with the selected metallic area 16A. In particular, this step can be performed by placing the intermediate product in a spatial relationship to a leadframe, wherein the external connectors 30 are given as particular portions of the leadframe. Thereafter bond wires 35 are connected between end portions of the external connectors 30 and the selected metallic areas 16A.

FIG. 4H shows the finalized semiconductor chip package 100 after applying a second encapsulation layer 20 onto the solder resist layer 18, wherein the second encapsulation layer 20 also encapsulates the bond wires 35, portions of the external connectors 30 and side faces 12C of the first encapsulation layer 12. The second encapsulation layer 20 has to be applied separately onto each individual module.

Figure 5A:
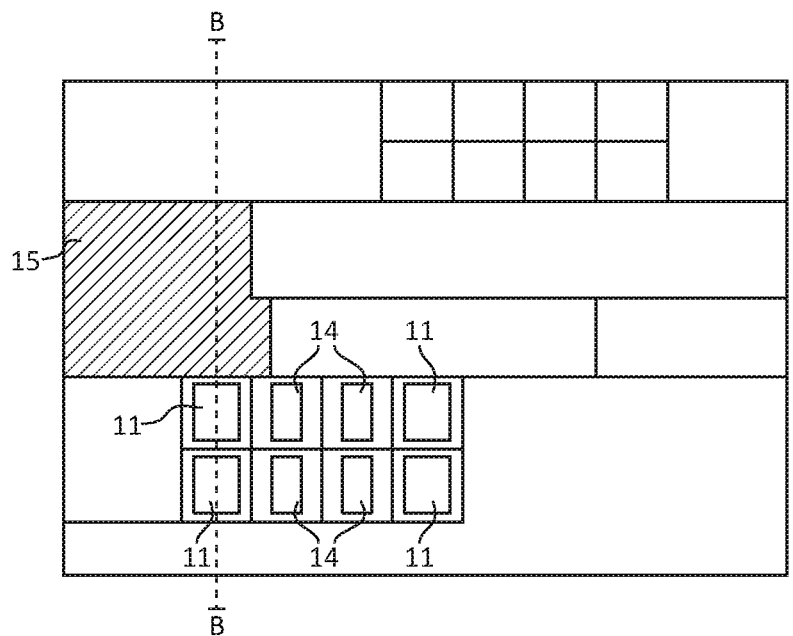
FIG. 5 includes FIG. 5A and 5B and shows a schematic top view representation (A) and a schematic cross-sectional side view representation (B) of an intermediate product such as that shown in in FIG. 3 wherein the intermediate product includes a thermal spreading area depicted as a hatched area.
Figure 5B:
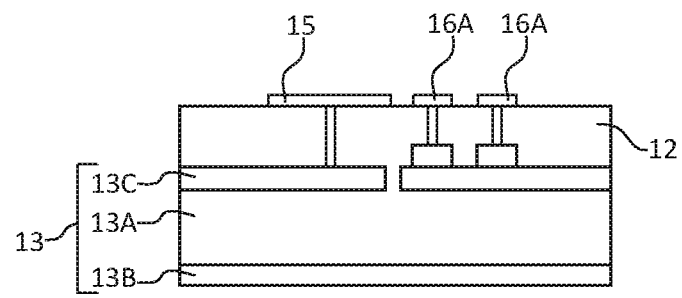

FIG. 5 includes FIG. 5A which shows essentially the same intermediate product as shown and described before in connection with FIG. 3 so that the description of features, which were described before, will not be repeated here. The intermediate product as shown in FIG. 5A shows a second metallic area 15 as it was indicated above. As depicted in FIG. 5B, the second metallic area 15 is disposed in one and the same horizontal plane as the first metallization areas 16A of the metallization layer 16 The second metallic area 15 has primarily no electrical function and the essential or only function of the second metallic area 15 is to dissipate excessive heat generated in the operation of the semiconductor chip package 100. For this purpose the second metallic area 15 is connected by a via connection in the first encapsulation layer 12 with an area of the upper metallic layer 13C of the DCB 13. It is also possible to form more than one or a plurality of via connections into the first encapsulation layer 12 and to connect the second metallic area 15 by the plurality of via connections with the area of the upper metallic layer 13C of the DCB 13. The intermediate product, as shown in FIG. 5A, shows only one second metallic area 15. However, it is also possible to arrange more than one second metallic area 15. It should be noted that the second metallic areas 15 can be connected with first metallic areas 16A, if appropriate. It should further be noted that those regions 13C which are connected with second metallic areas 15, are electrically isolated from other regions 13C.

Figure 6:
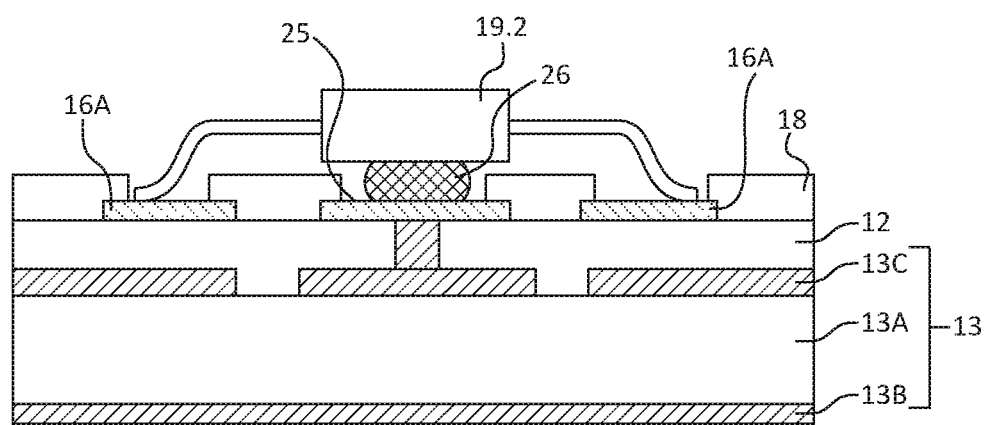
FIG. 6 shows a schematic cross-sectional side view representation of a partial section of a semiconductor chip package comprising a thermal spreading area underneath an electronic device disposed above the solder stop layer.

FIG. 6 shows a cross-sectional side view representation for illustrating a further example of arranging a second metallic area for dissipating excessive heat. In this case the second metallic area 25 is disposed onto the upper surface of the solder stop layer 18. An electronic device 19.2 which is known to produce heat during operation is disposed above the second metallic area 25 and connected with the second metallic area 25 by a thermally conductive material 26 like, e.g. a solder material or a thermally conductive paste. In order to efficiently dissipate the excessive heat, the second metallic area 25 is connected with an upper metallic layer 13C of the DCB 13 by a via connection formed in the first encapsulation layer 12.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A semiconductor chip package, comprising:
    a carrier;
    a plurality of semiconductor chips, each semiconductor chip having a first major surface disposed on the carrier and an opposing second major surface;
    a first encapsulation layer disposed above the plurality of semiconductor chips and having a first major surface parallel to the first major surfaces of the plurality of semiconductor chips;
    a metallization layer disposed directly on the first major surface of the first encapsulation layer above the plurality of semiconductor chips, the metallization layer comprising a plurality of first metallic areas forming electrical connections between selected ones of the plurality of semiconductor chips;
    a second encapsulation layer disposed above the metallization layer; and
    a plurality of external connectors, each one of the external connectors being connected with one of the first metallic areas and extending outwardly through a side surface of the second encapsulation layer.

2. The semiconductor chip package according to claim 1, wherein
    the carrier comprises a first main face, a second main face opposite to the first main face, and side faces connecting the first and second main faces, and wherein
    the first encapsulation layer is disposed on the first and second main faces and the side faces of the carrier.

3. The semiconductor chip package according to claim 2, wherein
    a solder resist layer disposed on the metallization layer; and
    the second encapsulation layer is disposed on a main face of the solder resist layer and on side faces of the solder resist layer and side faces of the first encapsulation layer.

4. The semiconductor chip package according to claim 1, wherein
    each one of the external connectors extend outwardly through a side face of the second encapsulation layer.

5. The semiconductor chip package according to claim 4, wherein
    the external connectors extend outwardly through two opposing side faces of the second encapsulation layer.

6. The semiconductor chip package according to claim 1, wherein
    the external connectors are part of a leadframe.

7. The semiconductor chip package according to claim 1, further comprising:
    electronic devices formed above the first metallic areas and connected to selected ones of the first metallic areas.

8. The semiconductor chip package according to claim 7, wherein
    the electronic devices are selected from the group of passive devices, active devices, resistors, shunt resistors, NTC resistors, inductors, capacitors, sensors, current sensors, drivers, and processors.

9. The semiconductor chip package according to claim 1, wherein
    the metallization layer comprises second metallic areas connected by via connections to an upper main face of the carrier.

10. The semiconductor chip package according to claim 1, wherein
    the external connectors are connected to selected ones of the first metallic areas by bond wires, respectively.

11. The semiconductor chip package according to claim 1, wherein
    at least selected ones of the first metallic areas are formed in such a way that they comprise bondable or solderable upper surfaces.

12. A semiconductor chip package, comprising:
    a carrier;
    a plurality of semiconductor chips disposed on the carrier;
    a first insulation layer disposed above the plurality of semiconductor chips and having a first major surface parallel to major surfaces of the plurality of semiconductor chips;
    a metallization layer disposed directly on the first major surface of the first insulation layer above the plurality of semiconductor chips, the metallization layer comprising a plurality of first metallic areas forming electrical connections between selected ones of the plurality of semiconductor chips;
    a second insulation layer disposed above the metallization layer; and
    a plurality of external connectors, each one of the external connectors being connected with one of the first metallic areas and extending outwardly through a side surface of the second insulation layer.

13. The semiconductor chip package according to claim 12, wherein
    the first insulation layer comprises via connections formed therein, the via connections connecting selected ones of the plurality of semiconductor chips with selected ones of the first metallic areas.

14. The semiconductor chip package according to claim 12, wherein
    the carrier comprises one or more of a direct copper bonded substrate, a direct aluminum bonded substrate, and an active metal brazing substrate, wherein the substrate comprises a ceramic layer or a dielectric layer.

15. The semiconductor chip package according to claim 12, wherein
    the plurality of semiconductor chips comprises a plurality of semiconductor transistor chips and a plurality of diode chips respectively.

16. The semiconductor chip package according to claim 15, wherein the plurality of semiconductor transistor and the plurality of semiconductor diode chips are connected to form an AC/AC converter circuit, an AC/DC converter circuit, a DC/AC converter circuit, a DC/DC converter circuit, or a frequency converter circuit.

17. A semiconductor chip package comprising:
a carrier;
a plurality of semiconductor chips on the carrier;
a first encapsulation layer above the plurality of semiconductor chips and the carrier and having a first major surface parallel to major surfaces of the plurality of semiconductor chips;
via connections extending through the first encapsulation layer to the first major surface, the via connections being connected with the plurality of semiconductor chips respectively;
a metallization layer disposed directly on the first major surface the first encapsulation layer above the plurality of semiconductor chips, the metallization layer comprising a plurality of first metallic areas connected with the respective via connections;
external connectors connected to selected ones of the first metallic areas; and
a second encapsulation layer above the metallization layer, wherein the external connectors extend outwardly through a side surface of the second encapsulation layer.

18. The semiconductor chip package according to claim 17, wherein the via connections comprise via holes filled with a metallic material.

19. The semiconductor chip package according to claim 17, further comprising:
a solder resist layer disposed on the metallization layer, wherein the second encapsulation layer is disposed above the solder resist layer and above side faces of the solder resist layer and side faces of the first encapsulation layer.

20. The semiconductor chip package according to claim 17, further comprising:
electronic devices formed above the first metallic areas and connected to selected ones of the first metallic areas.

* * * * *